(12) United States Patent
Sirhan

(10) Patent No.: US 7,664,579 B2
(45) Date of Patent: Feb. 16, 2010

(54) TEST INTERFACE FOR DIAGNOSING COMMUNICATION FAULTS IN AUTOMOBILES

(76) Inventor: Eddie Sirhan, 36133 Silverado Pl., Newark, CA (US) 94560

( * ) Notice: Subject to any disclaimer, the term of this patent is extended or adjusted under 35 U.S.C. 154(b) by 492 days.

(21) Appl. No.: 11/389,829

(22) Filed: Mar. 27, 2006

(65) Prior Publication Data

US 2007/0225880 A1 Sep. 27, 2007

(51) Int. Cl.
*G01M 17/00* (2006.01)
*G01R 31/08* (2006.01)

(52) U.S. Cl. .......................................... 701/29; 701/33
(58) Field of Classification Search ........................ None
See application file for complete search history.

(56) References Cited

U.S. PATENT DOCUMENTS

| | | | | |
|---|---|---|---|---|
| 4,498,716 A | * | 2/1985 | Ward ............................ | 439/55 |
| 5,177,447 A | * | 1/1993 | Marino et al. ................ | 324/713 |
| 5,214,582 A | * | 5/1993 | Gray ............................. | 701/33 |
| 5,532,927 A | * | 7/1996 | Pink et al. ...................... | 701/34 |
| 5,734,658 A | * | 3/1998 | Rall et al. .................... | 370/438 |
| 6,297,646 B1 | * | 10/2001 | Lang et al. ................... | 324/556 |
| 6,643,465 B1 | * | 11/2003 | Bösinger et al. ............... | 398/59 |
| 2006/0217855 A1 | * | 9/2006 | Chinnadurai et al. .......... | 701/29 |

* cited by examiner

*Primary Examiner*—Michael J. Zanelli
(74) *Attorney, Agent, or Firm*—Calvin B. Ward

(57) ABSTRACT

A diagnostic test interface circuit and method for using the same are disclosed. The circuit isolates communication links at a junction box having one pin for each of the communication links. The circuit includes a bus, a plurality of switches, and a plurality of connection leads. The switches each have a first terminal connected to the bus. Each connection lead includes a first end having a connector that connects to one of the pins and a second end that connects to a corresponding one of the switches such that the switch connects the connection lead to the bus when the switch is closed. The circuit can be used to diagnose a fault in a vehicle having a plurality of modules that communicate over a star-configured network.

8 Claims, 3 Drawing Sheets

1

TEST INTERFACE FOR DIAGNOSING COMMUNICATION FAULTS IN AUTOMOBILES

BACKGROUND OF THE INVENTION

Modern automobiles utilize a number of microprocessor-controlled modules to provide a variety of functions within the automobile. These modules provide both control and diagnostic function. Examples of such control modules are the modules that manage the seat functions and store the memorized seat configurations for particular occupants. Other modules are responsible for climate control, traction control, airbag deployment, radio, etc. A typical automobile may have as few as 4 or more than 40 modules. These modules are placed in various locations throughout the vehicle.

These modules communicate with each other over a serial data bus that connects all of the modules together. This bus also connects to the diagnostic connector, which is typically located under the dashboard of the vehicle. Problems with the modules are normally diagnosed by connecting a diagnostic computer to the diagnostic connector by using a standardized connector. The diagnostic computer then queries the modules to determine if the modules are functioning properly using programs that are provided for each make and model of vehicle.

This diagnostic system depends on the serial bus functioning properly. Unfortunately, modules are known to fail in a manner that either shorts the bus signal conductor to ground or to power. In the event of such a failure, none of the functioning modules can communicate over the bus. Similarly, a short in the communication line itself can lead to a similar problem.

If the bus is not functioning, the diagnostic computer cannot provide sufficient information to isolate the problem. In such situations, the technician is often reduced to disconnecting modules one at a time until the technician finds the module that is interfering with the bus. The modules in question are located at a number of locations on the vehicle. Many of these locations require a significant amount of labor to access. For example, a module located in the recesses of the dashboard may require that the dashboard be removed before the module can be accessed. Accordingly, the cost of servicing the vehicle when such a fault occurs can be substantial.

Techniques for avoiding this type of problem are known in the computer network arts. However, such techniques are poorly suited to the automobile environment, which places limitations on the cost of the protection, and the environment in which the network protection components must operate. In addition, a failure in the protection circuitry itself can lead to data losses that pose a safety hazard when the data is critical to the operation of a moving vehicle. Hence, automobile manufacturers have not utilized this solution.

In addition, there is a considerable investment in test equipment such as the diagnostic computers discussed above. Hence, any solution to this problem that involves changing the currently used diagnostic system can be prohibitively expensive. In addition, any change in the diagnostic procedures presents additional staff training costs, and hence, any solution to these problems needs to minimize the number of changes in the established procedures.

SUMMARY OF THE INVENTION

The present invention includes a circuit for isolating communication links at a junction box having one pin for each of the communication links and a method for using the same. The circuit includes a bus, a plurality of switches, and a plurality of connection leads. The switches each have a first terminal connected to the bus. Each connection lead includes a first end having a connector that connects to one of the pins and a second end that connects to a corresponding one of the switches such that the switch connects the connection lead to the bus when the switch is closed. The circuit can be used to diagnose a fault in a vehicle having a plurality of modules that communicate over a star-configured network. The star-configured network includes a hub at which a plurality of communication lines are connected together by means of a removable shunt. At least one of the communication lines is connected to one of the modules, and one of the communication lines is connected to a test interface connector. In the method of the present invention, the shunt is removed and replaced by the circuit of the present invention. One connection lead is connected to each of the communication lines in the hub. A diagnostic system is connected to the test interface connector. The diagnostic system tests the modules connected to the diagnostic system in response to a user input signal. The communication lines are selectively connected to the bus in groups by means of the circuit. Each group can include any subset of the lines, none of the lines in the hub, or all of the lines in the hub. For each group, the user input signal is generated and the diagnostic system is used to determine if the connected modules and the communication links connected to the bus are functioning properly.

DETAILED DESCRIPTION OF THE PREFERRED EMBODIMENTS OF THE INVENTION

Figures 1, 2:
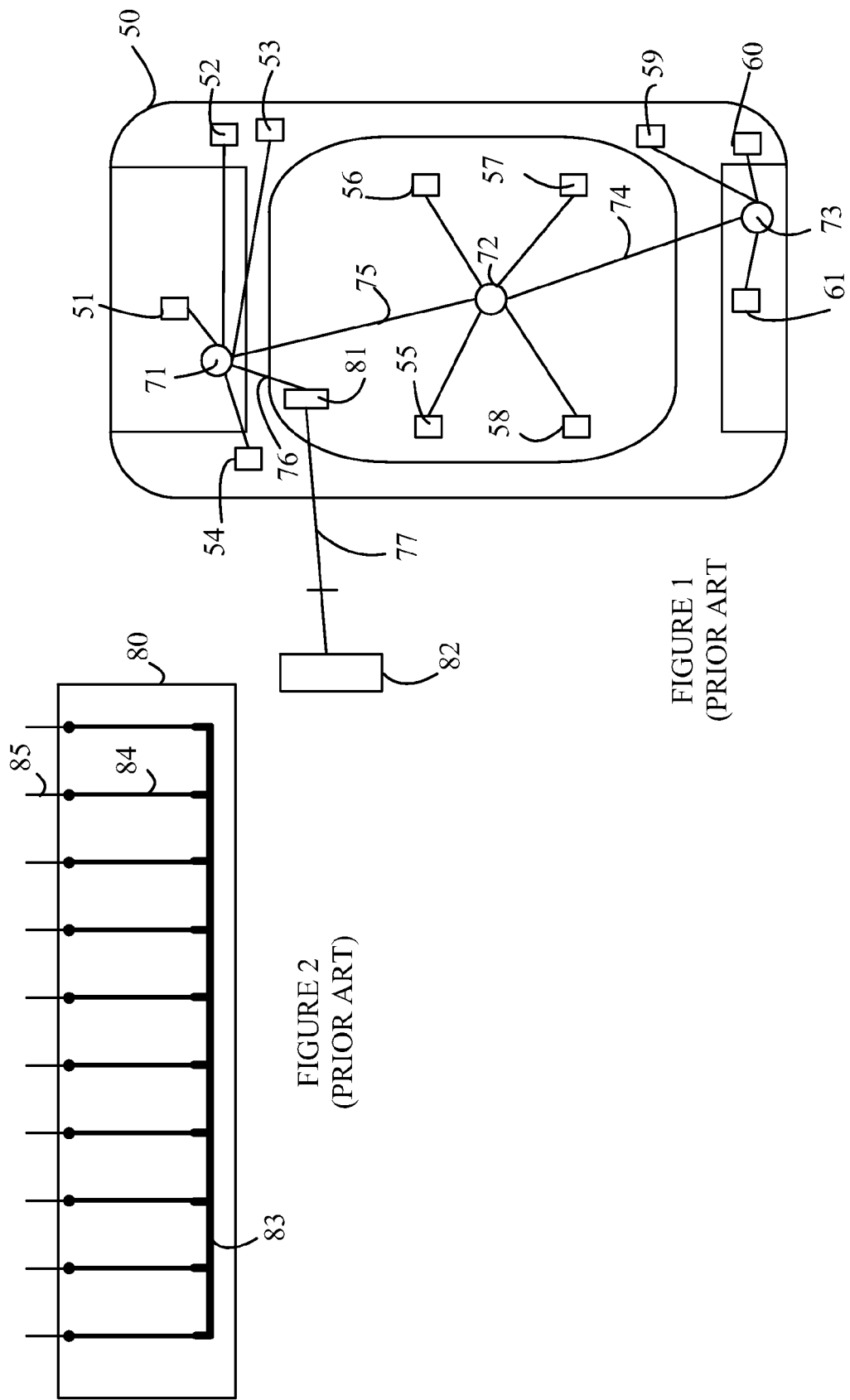
FIG. 1 illustrates the manner in which the various modules are organized within a vehicle.
FIG. 2 illustrates a typical hub of the type discussed above.

The present invention makes use of the observation that the network used to connect the various modules is a star-configured network and that the hubs of this network are accessible to a service technician. Refer now to FIG. 1, which illustrates the manner in which the various modules are organized within a vehicle 50. Exemplary modules are shown at 51-61 in FIG. 1. In general, the modules are organized into groups of modules that are connected to a hub. In the example shown in FIG. 1, modules 51-54 are connected to hub 71, which is located in the engine compartment; modules 55-58 are connected to hub 72, which is located in the passenger compartment, and modules 59-61 are connected to hub 73, which is located in the trunk. The hubs are also connected together by serial bus lines such as bus line 74 that connects hubs 72 and 73, and bus line 75 that connects hubs 71 and 72. In this example, hub 71 is also connected to diagnostic connector 81 by a bus line 76. A diagnostic computer 82 is typically connected to diagnostic connector 81 by a cable 77 during maintenance of the vehicle. It should be noted that diagnostic connector 81 also provides access to other electronic systems such as the vehicle computer through cable 77. To simplify the drawings, these connections have been omitted.

Refer now to FIG. 2, which illustrates a typical hub of the type discussed above. Hub 80 includes a plurality of pins such as pin 84. Each pin is connected to one of the communication lines serviced by the hub. The communication line connected to pin 84 is shown at 85. All of the pins in the hub are shorted together by a removable shunt 83.

Figure 3:
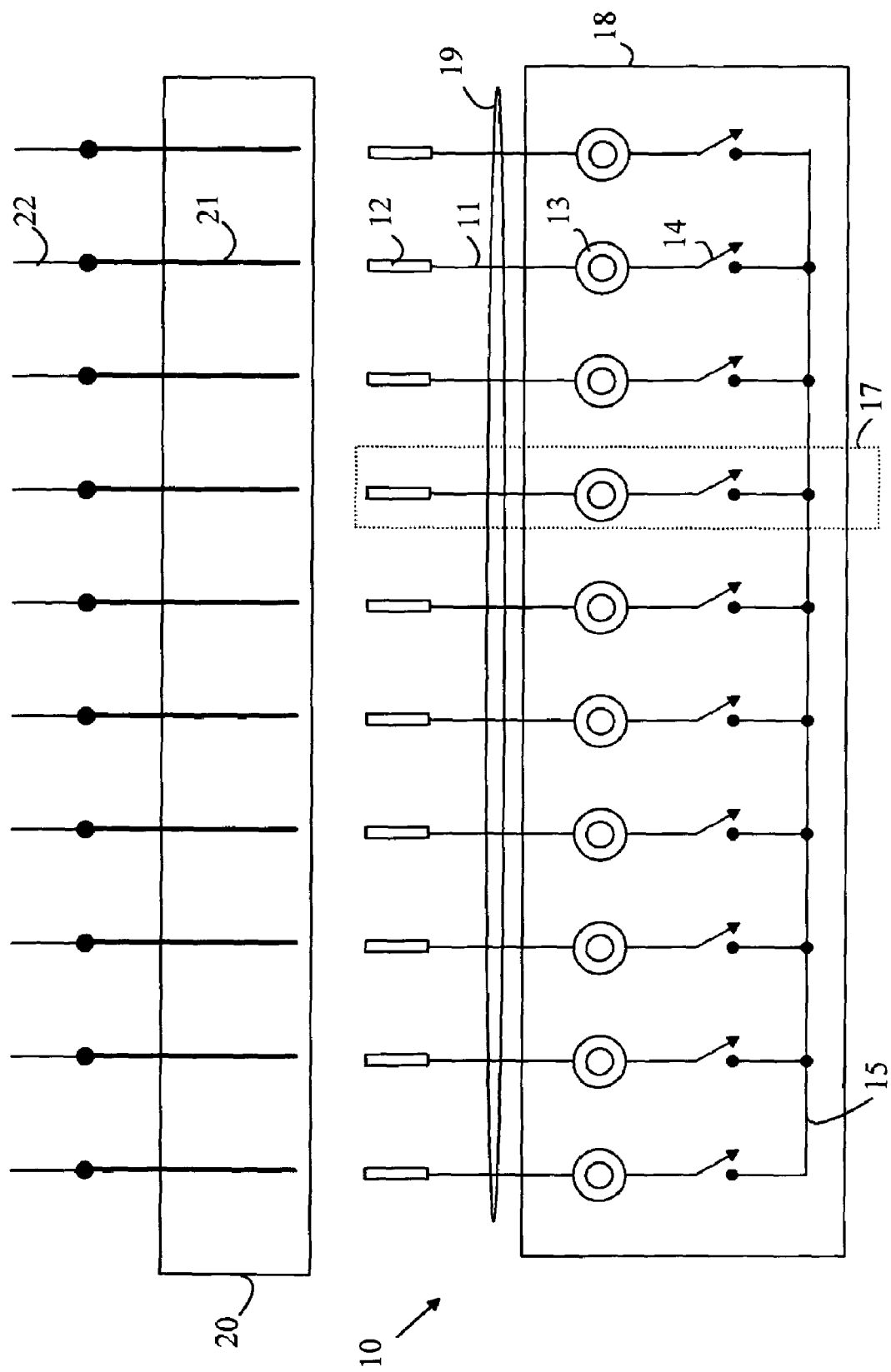
FIG. 3 is a schematic drawing of a test interface according to the present invention and a hub in an automobile.

The manner in which the present invention provides its advantages can be more easily understood with reference to FIG. 3, which is a schematic drawing of a test interface 10 according to the present invention and a hub 20 in an automobile. Shunt 83 discussed above has been removed from hub 20. Hub 20 includes a plurality of pins 21. Each pin is connected to a serial bus line 22, which, in turn, is connected to a corresponding module located somewhere in the automobile.

Test interface 10 includes a body 18 and a cable 19 having a plurality of leads such as lead 11. Test interface 10 replaces the shunt in the hub to which it is connected. Test interface 10 can be viewed as having a number of channels. An exemplary channel is shown at 17. Each channel connects a corresponding one of the pins in hub 20 to a bus 15. The number of channels is equal to the maximum number of pins in a hub. Each channel includes one of the leads in cable 19. Each lead terminates in a pin connector 12 that slips over a pin in hub 20. Each channel also includes a test point 13 that allows the signals on the hub pin connected to that channel to be viewed by a service technician independent of whether or not the lead in that channel is connected to bus 15. In addition, each channel includes a switch 14 that allows the service technician to disconnect the lead in that channel from bus 15. In the embodiment shown in FIG. 3, the switches 14 are assumed to be operated manually.

Figure 4:
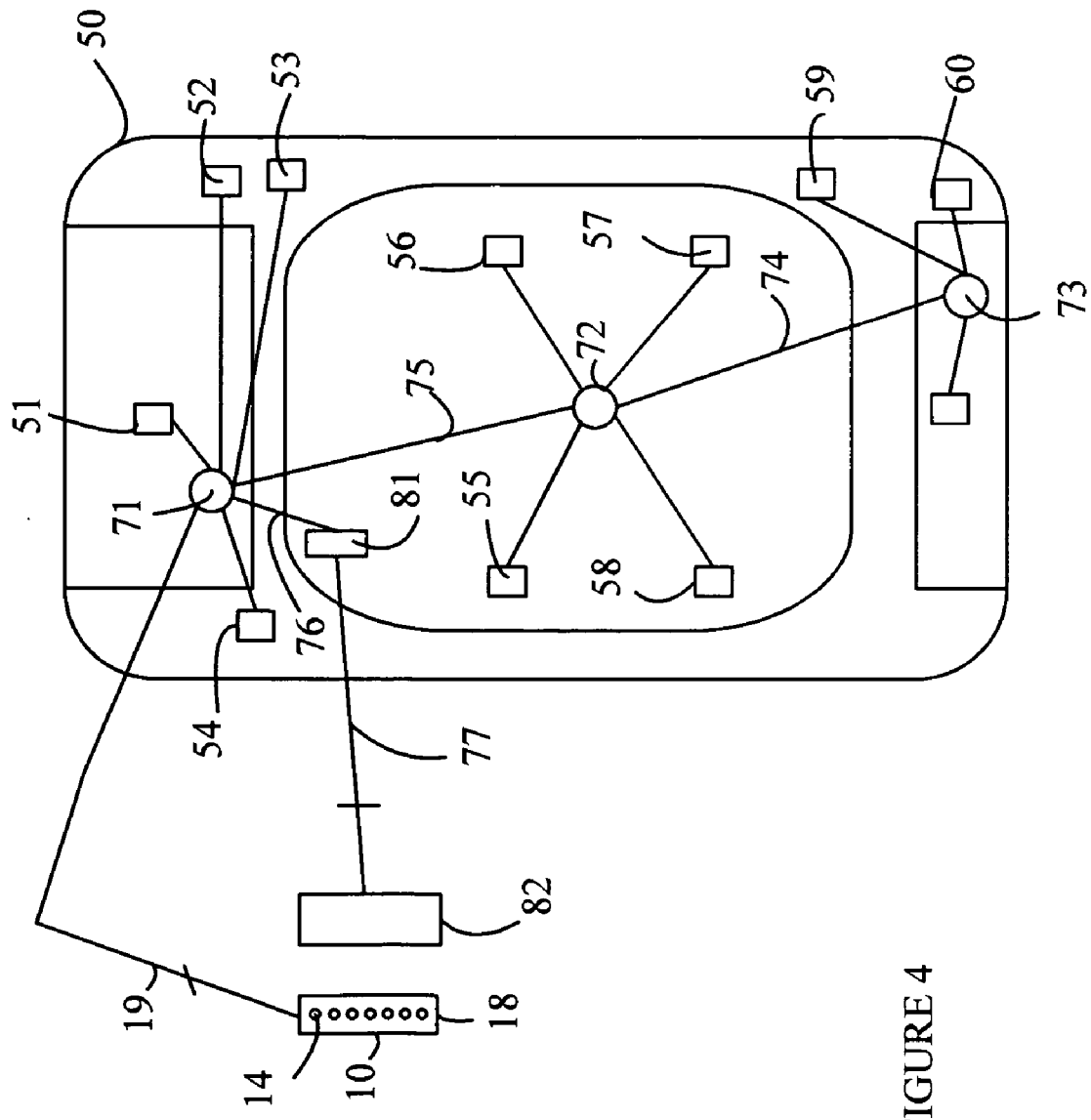
FIG. 4 illustrates the manner in which test interface 10 is utilized to identify a faulty module in an automobile.

The manner in which the test interface is utilized will now be discussed in more detail with reference to FIG. 4, which illustrates the manner in which test interface 10 is utilized to identify a faulty module in automobile 50. In this example, it is assumed that attempts to communicate with the various modules via diagnostic connector 81 have failed, and hence, the service technician assumes that one or more of the modules is shorting the serial bus to ground or one or more of the segments of the serial bus are shorted. In the first round of tests, test interface 10 is connected directly to a hub. In the following discussion, a device is defined as being directly connected to a hub if the connection between the device and the hub does not pass through any other hub. In the example shown in FIG. 4, this would be hub 71. Test interface 10 replaces the shunt that would normally be present in that hub. It should be noted that all of the signals flow through that hub in route to diagnostic connector 81. Cable 19 is long enough to stretch from any of the hubs in the vehicle to the area in which the test computer is located. Cable 19 is preferably at least 16 feet long. Body 18 of test interface 10 is positioned next to the test computer, and the switches 14 are located such that each switch can be accessed and actuated from outside of body 18.

Initially, all of the switches are closed so that the test interface duplicates the shunt that it replaced. The service technician then tests that the diagnostic computer still cannot communicate with the various modules. The service technician then opens one of the switches in test interface 10 thereby disconnecting the network segment and all of the modules connected to that segment from the network. The service technician then runs the diagnostic program again to determine if the diagnostic computer can now communicate with the remaining modules. If communication is now possible, the service technician then knows that the fault lies on the communication line that was disconnected by the switch in question. If the diagnostic computer still cannot communicate with the modules, then the service technician resets that switch and opens the next switch. The process is repeated until the segment having the fault is isolated, or until all of the network segments have been tried.

Alternatively, the service technician can open all of the switches except one and run the diagnostic test to determine if the diagnostic computer can communicate with the modules on the one network segment in question. If the diagnostic computer determines that the segment is functioning, the service technician can then connect another segment and retest until a segment fails. This second protocol has the advantage of detecting a case in which more than one network segment connecting to the hub in question has failed.

If the segment that failed is connected to a single module, the service technician can replace the module in question and repeat the test. If the test still fails, then the problem must be with the communication line connecting that module to the hub. If, on the other hand, the network segment that is failing connects the current hub to a second hub, then the service technician must move the test interface cable to the second hub and repeat the process. For example, if communication line 75 fails, then the test interface would be removed from hub 71 and the shunt replaced in hub 71. The test interface would then be substituted for the shunt in hub 72.

Once the test interface is installed in hub 72, the status of communication line 75 can be determined by opening all of the switches in test interface 10. If the diagnostic computer still cannot communicate with the modules attached to hub 71, then communication line 75 must be the source of the problem.

If communication line 75 is functioning correctly, then the remaining modules and their associated communication lines that connect to hub 72 can be tested in a manner analogous to that described above with reference to the testing of the components that connect to hub 71. This process is repeated with the remaining hubs until the identity of the failed module or communication line has been identified.

The above-described embodiments utilize a method in which specific groups of the communication lines connected at the hub to which the circuit of the present invention is connected are connected to the bus in the circuit. It will be appreciated that test algorithms based on connecting other groupings of the communication lines can be practiced without deviating from the teachings of the present invention. For the purposes of this discussion, the term group is defined to include all of the communication lines connected to the hub, and any subset of those lines including the null subset.

Various modifications to the present invention will become apparent to those skilled in the art from the foregoing description and accompanying drawings. Accordingly, the present invention is to be limited solely by the scope of the following claims.

What is claimed is:

1. A circuit for isolating communication links at a junction box having one pin for each of said communication links, said circuit comprising:

a bus;

a plurality of switches, having a first terminal connected to said bus; and a plurality of connection leads, each lead comprising a first end having a connector that connects to one of said pins and a second end that connects to a corresponding one of said switches such that said switch connects said connection lead to said bus when said switch is closed, wherein said bus shorts said first terminals of said plurality of switches together.

2. The circuit of claim 1 further comprising a plurality of test access points, each test access point being connected to one of said switches and being electrically connected to said first terminal of that switch.

3. The circuit of claim 1 wherein said switches are contained in a housing and said connection leads are longer than 16 feet.

4. The circuit of claim 3 wherein said bus is also contained in said housing.

5. The circuit of claim 3 wherein one of said switches is manually operable from outside of said housing.

6. A method for diagnosing a fault in a vehicle having a plurality of modules that communicate over a star-configured network, said star-configured network including a hub at which a plurality of communication lines are connected together by means of a shunt, at least one of said communication lines being connected to one of said modules, and one of said communication lines being connected to a test interface connector, said method comprising:

removing said shunt;

connecting a circuit comprising:

a bus;

a plurality of switches, having a first terminal connected to said bus; and a plurality of connection leads, each lead comprising a first end having a connector that connects to one of said communication lines and a second end that connects to a corresponding one of said switches such that said switch connects said connection line to said bus when said switch is closed;

connecting a diagnostic system to said test interface connector, said diagnostic system testing said modules connected to said diagnostic system in response to a user input signal; and connecting a group of said communication lines to said bus, generating said user input signal, and determining if said modules connected to said bus by said group of communication lines are functioning properly.

7. The method of claim 6 wherein said hub is directly connected to said test interface connector.

8. The method of claim 6 wherein said hub is connected to said test interface connector via an intermediate hub, and wherein only said communication line connecting said intermediate hub to said hub is connected to said bus when said user input signal is generated.

* * * * *